US010211168B1

(12) United States Patent
Chavali et al.

(10) Patent No.: US 10,211,168 B1
(45) Date of Patent: Feb. 19, 2019

(54) DISSIPATION OF STATIC CHARGE FROM WIRING LAYERS DURING MANUFACTURING

(71) Applicant: GLOBALFOUNDRIES INC., Grand Cayman (KY)

(72) Inventors: Krishna M. Chavali, Clifton Park, NY (US); Chien-Hsin Lee, Hsin-Chu (TW); Mahadeva Iyer Natarajan, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/841,372

(22) Filed: Dec. 14, 2017

(51) Int. Cl.
*H01L 23/52* (2006.01)
*H01L 23/60* (2006.01)
*H01L 23/522* (2006.01)
*H01L 21/768* (2006.01)
*H01L 21/66* (2006.01)
*H01L 23/528* (2006.01)

(52) U.S. Cl.
CPC ........ *H01L 23/60* (2013.01); *H01L 21/76802* (2013.01); *H01L 21/76877* (2013.01); *H01L 22/14* (2013.01); *H01L 23/5226* (2013.01); *H01L 23/5286* (2013.01)

(58) Field of Classification Search
CPC ......... H01L 21/76802; H01L 21/76877; H01L 23/5226; H01L 23/60; H01L 23/5286; H01L 22/14
USPC .......................................................... 257/759
See application file for complete search history.

(56) References Cited

U.S. PATENT DOCUMENTS

| 5,468,894 | A | 11/1995 | Yamaguchi et al. |
| 7,969,006 | B2 | 6/2011 | Lin et al. |
| 8,110,875 | B2 | 2/2012 | Ellis-Monaghan et al. |
| 8,194,371 | B2 | 6/2012 | Tang et al. |
| 8,431,982 | B2 * | 4/2013 | Kim ...................... H01L 29/861 |
| | | | 257/306 |

(Continued)

OTHER PUBLICATIONS

Lee et al., "Scrubber Clean Process Induced CDM ESD-Like: CSM (Charged Surface Model) Event Caused by Dummy Patterns," IEEE 46th IRPS, 2008, pp. 315-318.

(Continued)

*Primary Examiner* — Luan C Thai
(74) *Attorney, Agent, or Firm* — Gibb & Riley, LLC; Anthony J. Canale

(57) ABSTRACT

Methods form integrated circuit structures that include a device layer having electronic devices on a substrate, and a multi-layer interconnect structure connected to the device layer. The multi-layer interconnect structure includes alternating insulator layers and wiring layers, power and ground wiring in the wiring layers, non-functional wiring in the wiring layers called dummy fill, and conductive vias extending through the insulator layers. The conductive vias connect the power and ground wiring in the wiring layers to the electronic devices in the device layer. The non-functional wiring is insulated from the power wiring in the wiring layer, and from the electronic devices in the device layer. The conductive vias connect the non-functional wiring (the dummy fill) in the wiring layers through the substrate, or a ground bus, thereby continuously removing static charge that would otherwise accumulate during manufacturing processes.

20 Claims, 11 Drawing Sheets

(56) References Cited

U.S. PATENT DOCUMENTS

| | | | |
|---|---|---|---|
| 8,803,206 B1 | 8/2014 | Or-Bach et al. | |
| 9,276,104 B2 * | 3/2016 | Tsunemi | H01L 27/12 |
| 9,978,756 B2 * | 5/2018 | Kim | H01L 23/528 |

OTHER PUBLICATIONS

Lee et al., "The Mechanism of Device Damage During Bump Process for Flip Chip Package," IEEE 47th IRPS, 2009, pp. 676-681.

Ajioka et al., "A Method of Eliminating B-Mode Dielectric Breakdown Failure in Gate Oxides Utilizing a Charging Phenomenon," IEEE Transactions on Electron Devices, vol. 40, No. 12, 1993, pp. 2282-2286.

Etherton et al., "Study of CDM Specific Effects for a Smart Power Input Protection Structure," EOS/ESD Sym., 2004, pp. 1-10.

Notermans et al., "The Effect of Silicide on Esd Performance", IEEE 37th IRPS, 1999, pp. 154-158.

Lukaszek et al., "Characterization of Wafer Charging Mechanisms and Oxide Survival Prediction Methodology", 32nd IRPS/IEEE, 1994, pp. 334-338.

Jacob et al., "Surface Electrostatic Damage by Microprocess Robotic Machines: Diagnosis and Reliability, Process Auditing, and Remedies," IEEE Transactions on Device and Materials Reliability, vol. 6, No. 2, 2006, pp. 213-220.

\* cited by examiner

DISSIPATION OF STATIC CHARGE FROM WIRING LAYERS DURING MANUFACTURING

BACKGROUND

Field of the Invention

The present disclosure relates to processes and structures for integrated circuits, and more specifically, to processes and structures that remove the static charge that can accumulate in wiring layers during manufacturing.

Description of Related Art

When manufacturing integrated circuit structures, it is common to form electronic devices, such as transistors, diodes, capacitors, etc., in one or more layers, and then form multiple interconnect wiring layers on the logic (electronic) devices.

In order to prevent yield loss caused by a loading effect during the manufacturing, each layer in any region of a chip is designed to meet a minimum pattern density rule. Such regions often use dummy patterns, which are not electrically connected to anything, if any layer on a device cannot meet the minimum pattern density rule. These dummy patterns are essentially structural-only wiring elements, and are often referred to as dummy wiring or dummy fill because they are isolated from all other elements.

One issue that occurs when manufacturing integrated circuit structures is that the deposition, polishing, cleaning, etc., processes can produce a static charge built up in the electronic devices and the interconnect wiring. Undesirably, if such a static charge is present, when the electronic devices are tested, the static charge can damage the electronic devices, reducing yield. For example, the dummy fill used in the back-end-of-line (BEOL) processing that forms the interconnect wiring layers accumulates charges during chemical-mechanical processing (CMP), deposition steps, and scrubber clean steps; and the built-up charge eventually discharged when wafers are first probed or tested; and this can cause damage, leading to yield losses.

SUMMARY

Various methods herein form various integrated circuit structures. Some of these methods connect a substrate to a grounded chuck, and then form logic (electronic) devices on the substrate to form a device layer. Such methods also form alternating insulator layers and wiring layers on the device layer to produce a multi-layer interconnect structure on the device layer by patterning power and ground wiring in the wiring layers, patterning non-functional wiring in the wiring layers, and patterning conductive vias extending through the insulator layers. The conductive vias are formed to connect the power and ground wiring in the wiring layers to the electronic devices in the device layer. Also, these methods form power source and ground source connectors connected to the power and ground wiring.

The conductive vias are formed to connect the non-functional wiring in the wiring layers to a ground connection (where the ground connection is the substrate and/or the ground wiring). More specifically, each of the wiring layers is formed to include an electrical connection from the non-functional wiring to the ground connection (e.g., through Vss bus lines or grounded P+ well taps (e.g., by place and route automatically)). Thus, the non-functional wiring is formed to be electrically connected to the ground connection, and the non-functional wiring is formed to be insulated from the power wiring in the wiring layer and from the electronic devices in the device layer.

After manufacture, these methods test the electronic devices by sending test signals through the power and ground wiring. The substrate provides a static charge dissipation path from the wiring layers to the grounded chuck during manufacturing. For example, the substrate is held by the grounded chuck during all manufacturing steps. Also, the substrate is formed to include conductive wells electrically connected to the non-functional wiring. Therefore, the wiring layers are devoid of static charge during the testing. In other words, the conductive vias connect the non-functional wiring in the wiring layers to the substrate, thereby continually removing static charge that would otherwise accumulate during manufacturing processes.

Such processing forms various integrated circuit structures that include (among other components) a device layer on a substrate. The device layer has logic (electronic) devices. Also, with these structures, a multi-layer interconnect structure is connected to the device layer. The multi-layer interconnect structure has alternating insulator layers and wiring layers, power and ground wiring in the wiring layers, non-functional wiring in the wiring layer, and conductive vias extending through the insulator layers. The conductive vias connect the power and ground wiring in the wiring layers to the electronic devices in the device layer. The conductive vias connect the non-functional wiring in the wiring layers to the substrate. Power source and ground source connectors are connected to the power and ground wiring.

The non-functional wiring is insulated from the power wiring in the wiring layer and from the electronic devices in the device layer. Thus, each of the wiring layers includes an electrical connection from the non-functional wiring to the ground connection (where the ground connection is the substrate and/or the ground wiring).

Therefore, the substrate is electrically connected to ground to dissipate charge accumulated in the multi-layer interconnect structure during manufacturing. For example, the substrate is connectable to a grounded chuck that holds the substrate during manufacturing. Also, to promote static charge transfer to the grounded chuck, the substrate can include conductive wells electrically connected to the non-functional wiring. In other words, the conductive vias connect the non-functional wiring in the wiring layers to the ground connection, thereby continually removing static charge that would otherwise accumulate during manufacturing processes.

BRIEF DESCRIPTION OF THE DRAWINGS

The embodiments herein will be better understood from the following detailed description with reference to the drawings, which are not necessarily drawn to scale and in which.

DETAILED DESCRIPTION

Figure 1:
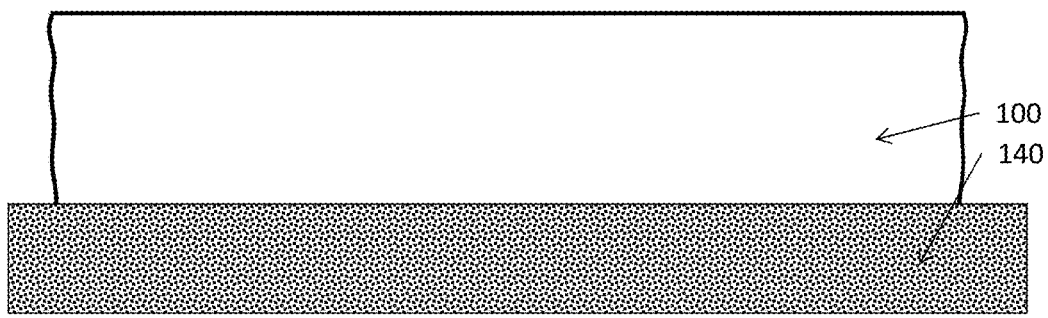
FIGS. 1-9 are schematic diagrams illustrating cross-sectional views (along lines A-A in FIGS. 10 and 11) of partially completed integrated circuit structures that demonstrate processing herein.

As mentioned above, the dummy fill used in processing that forms non-functional interconnect wiring layers accumulates static charges during chemical-mechanical processing (CMP), deposition steps, and scrubber clean steps. For example, the dummy fill forms a floating mesh that cumulates charges both in the connected and non-connected dummy fill pattern types. Even with variations that skip levels of dummy fill, there is a possibility of some charge accumulation. Such static charges are discharged when wafers are first probed or tested; and this can cause damage, leading to yield losses. Thus, once the charge accumulation happens, it gets discharged when the wafers are first probed/tested (at ET or sort/final test) causing electrostatic discharge (ESD) damage, resulting in high yield losses.

The devices and methods herein address these issues by removing charges from dummy fill wiring instantaneously, to maintain wafers at a charge neutral state at each successive processing step. Such processes connect the dummy fill to the substrate (that is connected to a grounded chuck) or connect such to the ground bus. This connection permits continuous removal of charge at all process steps.

More specifically, by connecting the dummy fill to the substrate, there is a continuous removal of charge, if any, thereby eliminating the charge accumulation and the possibility of discharge at subsequent process steps or probing/testing. The substrate is available at all processing steps, thereby removing any charge that has built up. As the substrate is always on the chuck that is grounded, there will be continuous removal of charge at all times, either during in-line process, or at probing/testing and assembly steps. Without static charge accumulation, as the dummy metal fill patterns are connected to the substrate and/or to the ground bus, the discharge events are completely eliminated. The features disclosed herein are applicable to any wafer process since the wafer on the chuck continuously removes charges; and such benefits also occur during post-fabrication processing and testing, and even after the dies are singulated at assembly, as the charge will be removed through the connection to the ground bus.

Therefore, in these devices the existing dummy fill pattern generation is reused, with a change to connect the dummy fill wires to the substrate or the ground bus, at least at one point per layer. This allows static charge dissipation for both connected (by vias across different metal layers) and non-connected or floating dummy fill pattern types. Further, this eliminates the need to optimize the inter-layer and intra-layer dummy fill patterns. Additionally, the methods described herein work across all BEOL stacks, irrespective of number of metal layers used, and work across all technology nodes. Therefore, the structures and methods herein improve static charge protection of the circuits from outside the device. There are no side effects or any other expected impact to the circuits; and, to the contrary, the devices are more protected from charge accumulation with the methods and structures herein. Also, these structures and methods avoid any charge accumulation due to wafer handling during post fabrication bumping and assembly and will protect the chips as the substrate is always connected to Vss/ground.

FIGS. 1-9 show processing herein that forms various integrated circuit structures. As shown in FIG. 1, processing begins by connecting a substrate 100 to a holding device (chuck 140) that is grounded (connected to a ground). While the substrate 100 is shown as a single layer, it can be multiple layers. While not being a pure conductor, but instead mostly a semi-conductor, the substrate 100 has sufficient limited conductivity to provide a static charge dissipation path to the grounded chuck 140 throughout all the manufacturing steps described herein.

Figure 2:
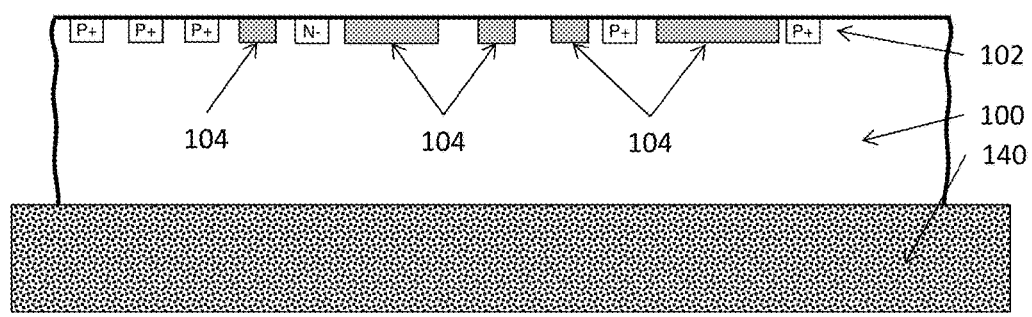

Next, as shown in FIG. 2, this processing also forms logic (electronic) devices 104 (e.g., transistors, diodes, capacitors, etc., that are discussed in greater detail below) on/in areas of the substrate 100, to form what is referred to herein as a device layer 102. Any methods/processing can be used to form such devices, whether currently known or developed in the future. Also, this device layer 102 is formed to create some conductive wells (e.g., p-wells (p+) and n– wells (n–)), that are formed by, for example, patterned impurity implantation into the substrate 100. More specifically, p-wells are formed by implanting impurities such as boron, aluminum or gallium, etc.; while n-wells are formed by implanting impurities such as antimony, arsenic or phosphorous, etc. These p-wells and n-wells increase the conductivity of the substrate 100 to assist in providing a static charge dissipation path to the grounded chuck 140.

Figure 3:
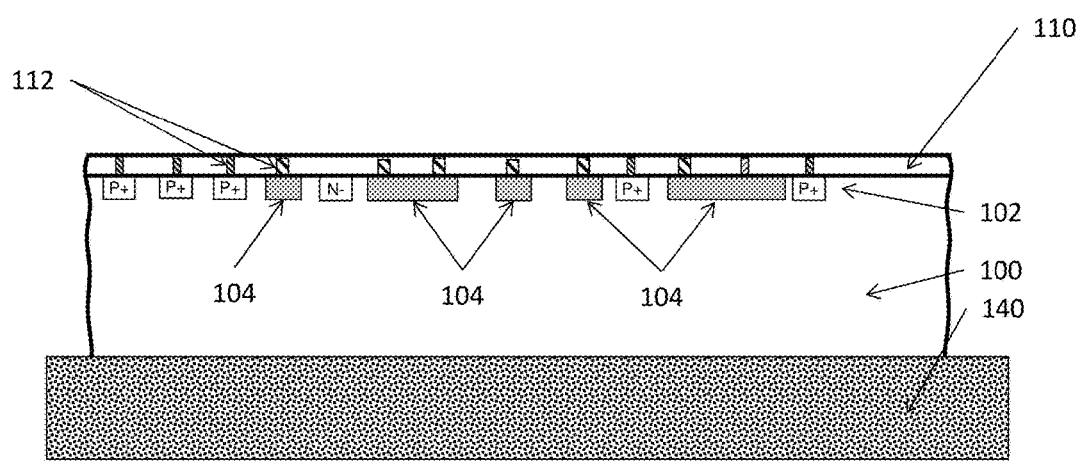

This processing also forms alternating insulator layers 110 and wiring layers M0-M6 on the device layer 102 to produce a multi-layer interconnect structure on the device layer 102, as shown in FIGS. 3-8. More specifically, as shown in FIG. 3, the multi-layer interconnect structure is formed by forming an insulator layer 110 (such as an inter-layer dielectric (ILD)), patterned with conductive vias 112, that extend through the insulator layer 110. As shown in FIG. 3 this processing forms some of the vias 112 so that some of the vias 112 are connected to the p-wells and n-wells. As discussed above, the processing that forms the vias 112 can include steps, which can create a static charge. For example, static charge can build up during deposition, polishing, and cleaning steps (such as chemical mechanical polishing (CMP)). However, the vias 112 that are connected to the p+ wells allow this static charge to be dissipated through the substrate 100 to the grounded chuck 140. This removes the static charge before the next processing step.

Figure 4:
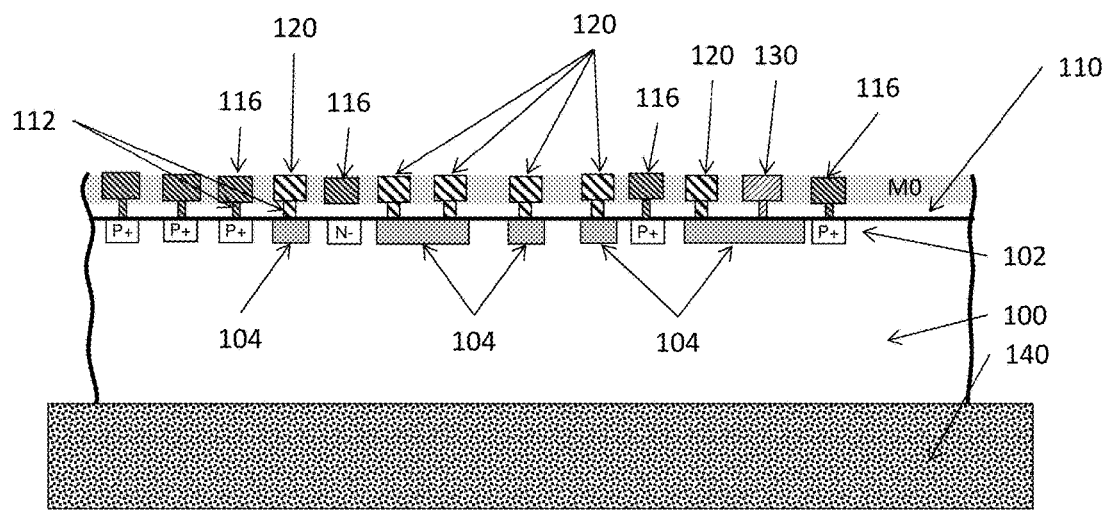

Next, as shown in FIG. 4, such processing patterns functional wiring 120, 130 (power wiring 120 and ground wiring 130) and simultaneously patterns non-functional wiring 116 (dummy fill) in a wiring layer M0 (where conductors 116, 120, 130, are patterned and then covered with yet another insulator that is formed on the previous insulator layer 110). The non-functional wiring 116 is not connected to any of the electronic devices 104 in the device layer 102, and instead, the non-functional wiring 116 is only formed to normalize the metal density across each metal layer and/or to add structural support to the wiring layers M0-M6.

When forming the conductors 116, 120, 130, the power wiring 120 and ground wiring 130 are formed in the wiring layer M0 to connect to the electronic devices 104 in the device layer 102 through the vias 112. In contrast, the non-functional wiring 116 that is connected to the p+ wells in the substrate 100, provides a static charge dissipation path through the substrate 100 to the grounded chuck 140. Again, the processing that forms the conductors 116, 120, 130, can include steps that can create a static charge. However, the non-functional wiring 116 that is connected to the p+ wells in the substrate 100, through the vias 112, allows this static charge to be dissipated through the substrate 100 to the grounded chuck 140. This removes the static charge at least within the non-functional wiring 116 before the next processing step that forms additional conductive vias.

Figure 5:
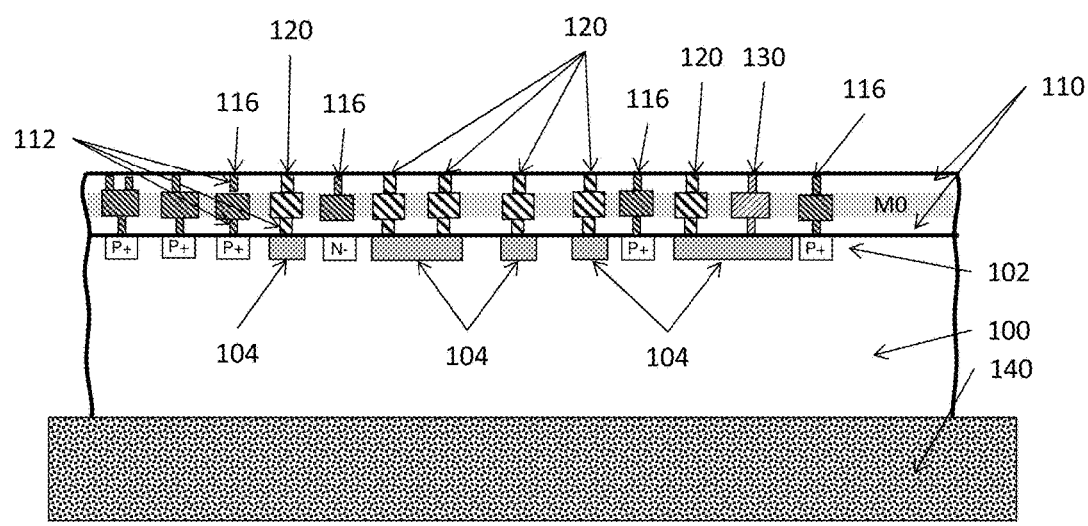
Figure 6:
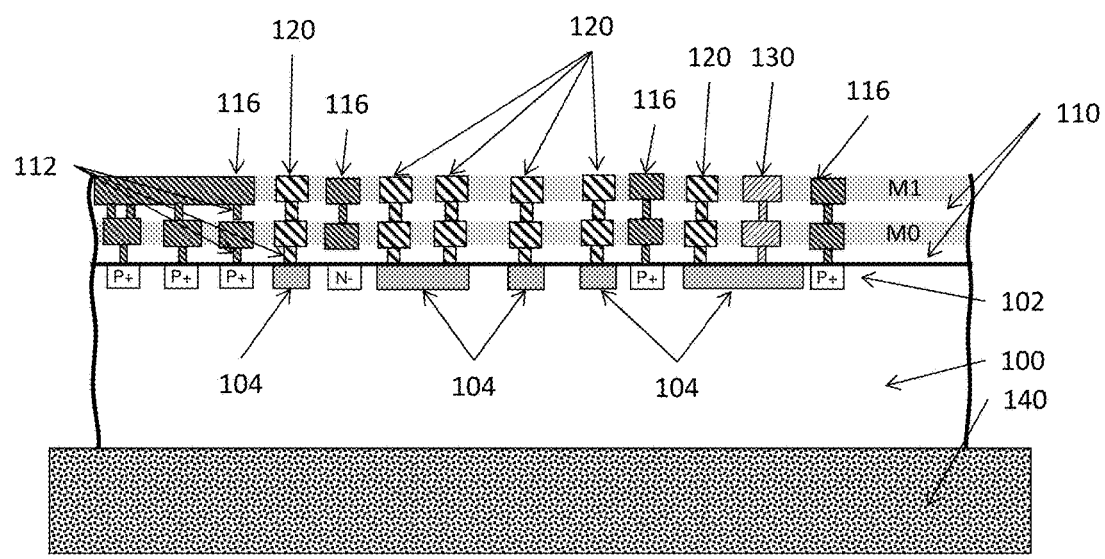

As shown in FIG. 5, the processing shown in FIG. 3 is repeated to form the next layer of conductive vias 112, and in FIG. 6, the processing shown in FIG. 4 is repeated to form the next layer of conductive wiring 116, 120, 130. This begins forming wiring stacks for the functional wiring 120, 130 (power wiring 120 and ground wiring 130) and the non-functional wiring 116 (dummy fill), which are so labeled in the drawings in layers M0-M1. Again, the processing that forms the vias 112 and the conductors 116, 120, 130, in FIGS. 5 and 6 can also include steps that can create a static charge. However, as discussed above, the non-functional wiring 116 that is connected through the p+ wells to the substrate 100, through the vias 112, allow this static charge to be removed through the substrate 100 to the grounded chuck 140 before the next processing step.

Figure 7:
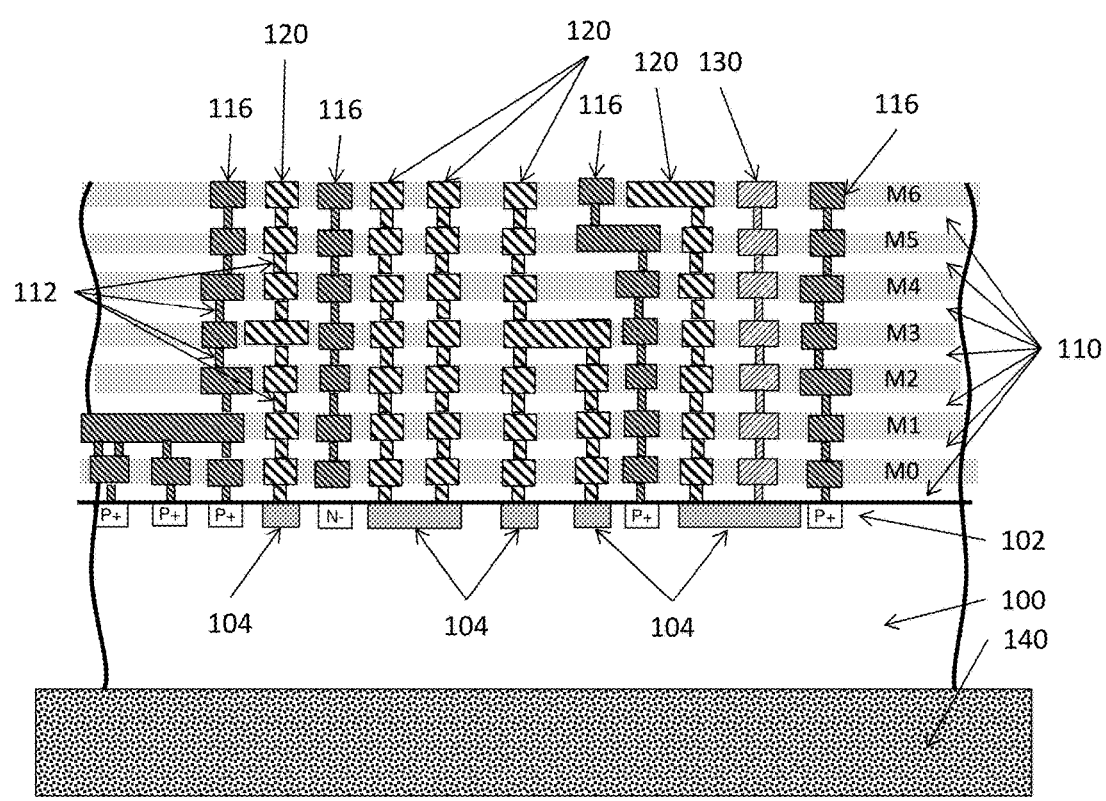

As shown in FIG. 7, the processing shown in FIGS. 3 and 4 is again repeated multiple times, to form additional insulator layers 110 and wiring layers M0-M6, to complete the multi-layer interconnect structure. In successive layers, the conductive vias 112 are formed to electrically connect the functional and non-functional wiring 116 in the different wiring layers M0-M6. Once again, this processing can create a static charge; however, the non-functional wiring 116 that is connected through the p-wells to the substrate 100, through the vias 112, allows this static charge to be removed through the substrate 100 to the grounded chuck 140 at each processing step.

As shown in FIG. 7, the non-functional wiring 116 in different wiring layers M0-M6 is formed to be electrically connected to the grounded chuck 140 through the substrate 100. Thus, the non-functional wiring 116 is formed to be insulated from the power wiring 120 but connected to the ground wiring 130 in the wiring layers M0-M6, and to be insulated from the electronic devices 104 in the device layer 102 (except the ground connection). The substrate 100 provides a static charge dissipation path to the grounded chuck 140 as the device layer 102 and each of the alternating insulator layers 110 and wiring layers M0-M6 are formed.

Figure 8:
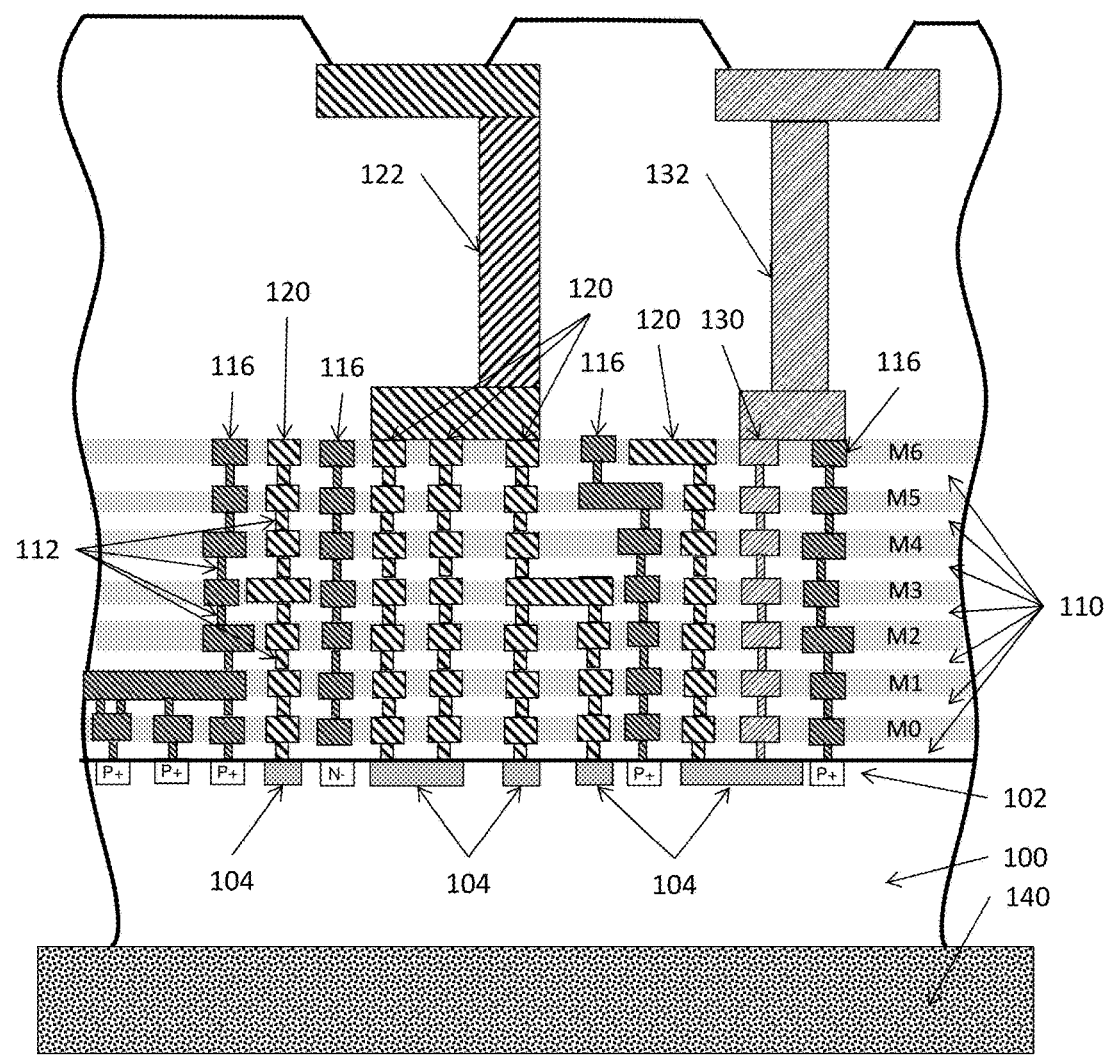

After the multi-layer interconnect structure is completed, as shown in FIG. 7, these processes then form (as shown in FIG. 8) power source connectors 122 and ground source connectors 132, that connect to the power wiring 120 and ground wiring 130. For example, one or more additional insulator layers can be formed, and a pattern of one or more conductors 122, 132 can be formed. Also, as shown in FIG. 9, external probe connections (such as solder balls 124, 134) can be formed to allow power, ground, signal, etc., connections.

Thus, for example, test signals can be provided to the electronic devices 104 through the power source connectors 122, 124 and ground source connectors 132, 134 to test the electronic devices 104. Because the non-functional wiring 116, vias 112, and p-wells in the substrate 100 provide a conductive static charge dissipation path to the grounded chuck 140 during each and all manufacturing steps described herein, when the electronic devices 104 are tested, no static charge remains, which reduces the chance of damage caused by static charges.

Figure 9:
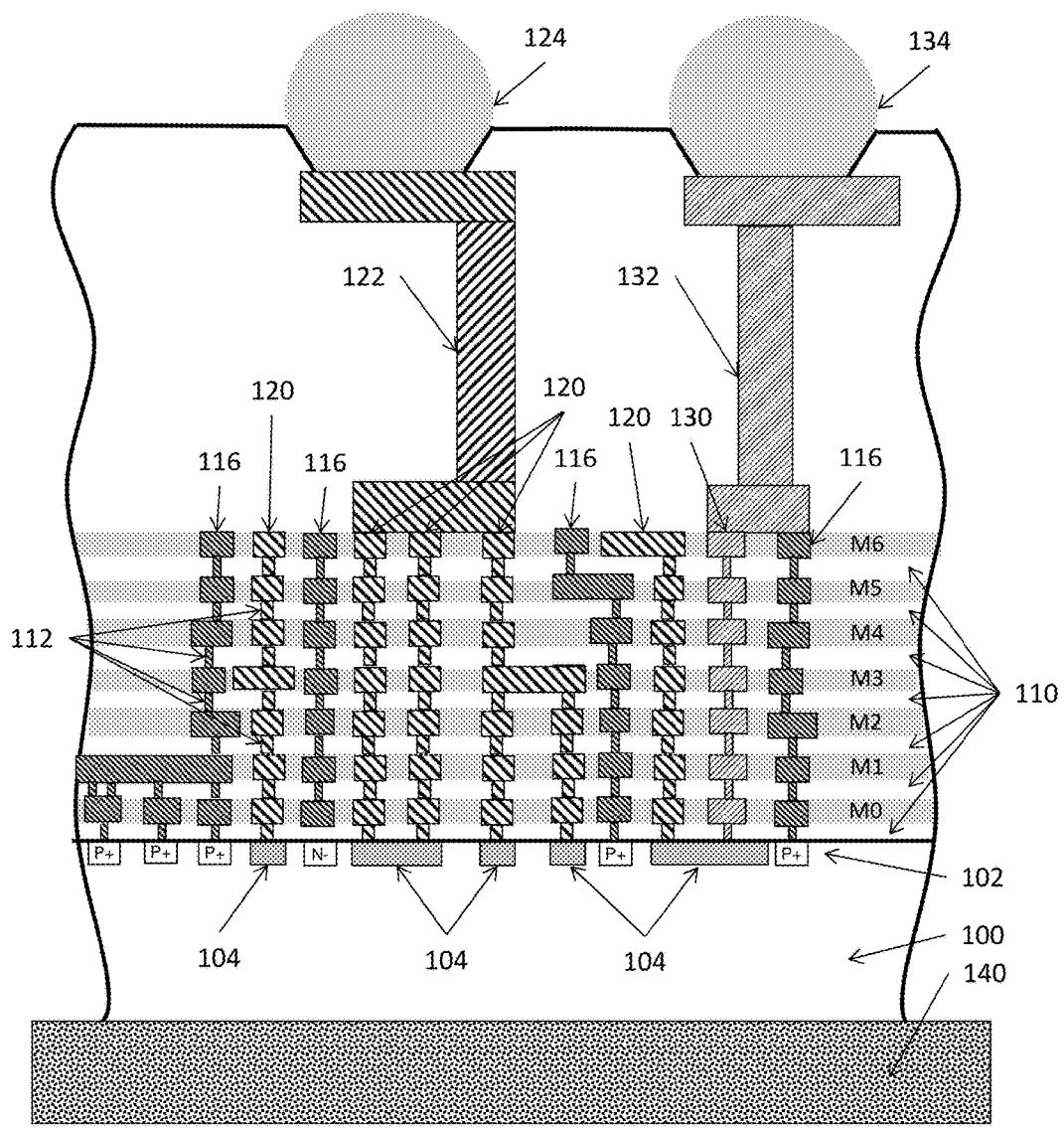

Therefore, as shown in FIG. 9, such processing forms various integrated circuit structures that include (among other components) a device layer 102 on a substrate 100. The device layer 102 has electronic devices 104. Also, with these structures, a multi-layer interconnect structure is connected to the device layer 102.

The multi-layer interconnect structure has alternating insulator layers 110 and wiring layers M0-M6, power and ground wiring 120, 130 in the wiring layers M0-M6, non-functional wiring 116 in the wiring layers M0-M6, and conductive vias 112 extending through the insulator layers 110. The conductive vias 112 connect the power and ground wiring 120, 130 in the wiring layers M0-M6 to the electronic devices 104 in the device layer 102. The conductive vias 112 connect the non-functional wiring 116 in the wiring layers M0-M6 to the substrate 100 and to the ground wiring 130. Power source and ground source connectors 122, 124, 132, 134 are connected to the power and ground wiring 120, 130.

The non-functional wiring 116 is insulated from the power 120 in the wiring layer, and from the power or signals of the electronic devices 104 in the device layer 102. Thus, the wiring layers M0-M6 includes an electrical connection from the non-functional wiring 116 to the substrate 100 or the ground wiring 130. In other words, the non-functional wiring 116 is only electrically connected to the grounded chuck 140 (e.g., through the substrate 100) or to the ground wiring 130.

The substrate 100 is electrically connected to ground to dissipate charge accumulated in the multi-layer interconnect structure; at least during manufacturing of the multi-layer interconnect structure. For example, the substrate 100 is connectable to the grounded chuck 140 that holds the substrate 100 during manufacturing of the multi-layer interconnect structure. Also, to promote static charge transfer to the grounded chuck 140, the substrate 100 can include conductive wells (p+) connected to the non-functional wiring 116. In other words, the conductive vias 112 connect the non-functional wiring 116 in the wiring layers M0-M6 to the substrate 100, thereby continually removing static charge that would otherwise accumulate during manufacturing processes.

Figure 10:
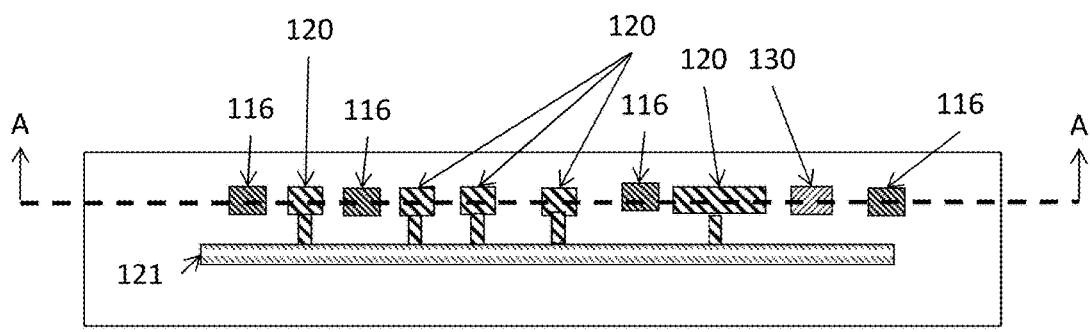
FIGS. 10 and 11 are schematic diagrams illustrating top (plan) views of integrated circuit structures herein.
Figure 11:
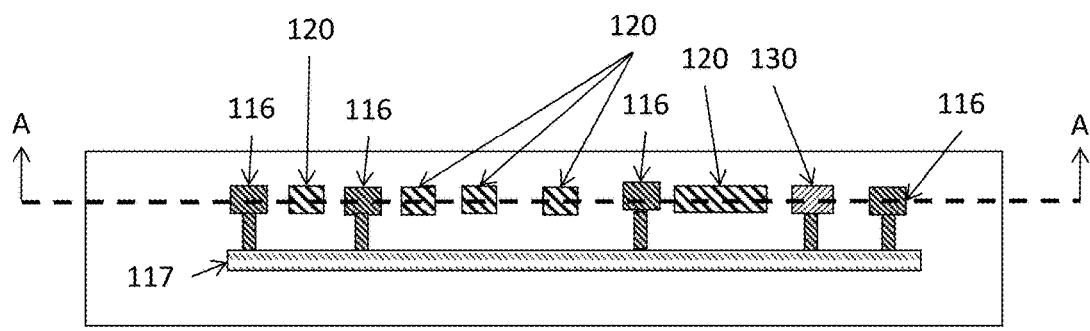

As shown in top-view in FIG. 10, in at least some of the wiring layers, intra-layer wiring conductors 121 (e.g., a power bus) electrically connect together all the functional wiring 120. As shown in top-view in FIG. 11, in at least some of the wiring layers, other intra-layer wiring conductors 117 (e.g., a ground bus) electrically connect all the non-functional wiring 116. Note that FIGS. 10 and 11 illustrate line A-A, which is the cross-section shown in FIGS. 1-9. Further, stacks of non-functional wiring 116 existing over a n– well are connected to the p+ wells through the ground bus 117, and through other stacks of non-functional wiring 116, allowing such stacks of non-functional wiring 116 to also be connected to the grounded chuck 140 through the substrate 100 (even if such a direct connection to the grounded chuck 140 is not shown in the view presented in FIGS. 1-9).

Figure 12:
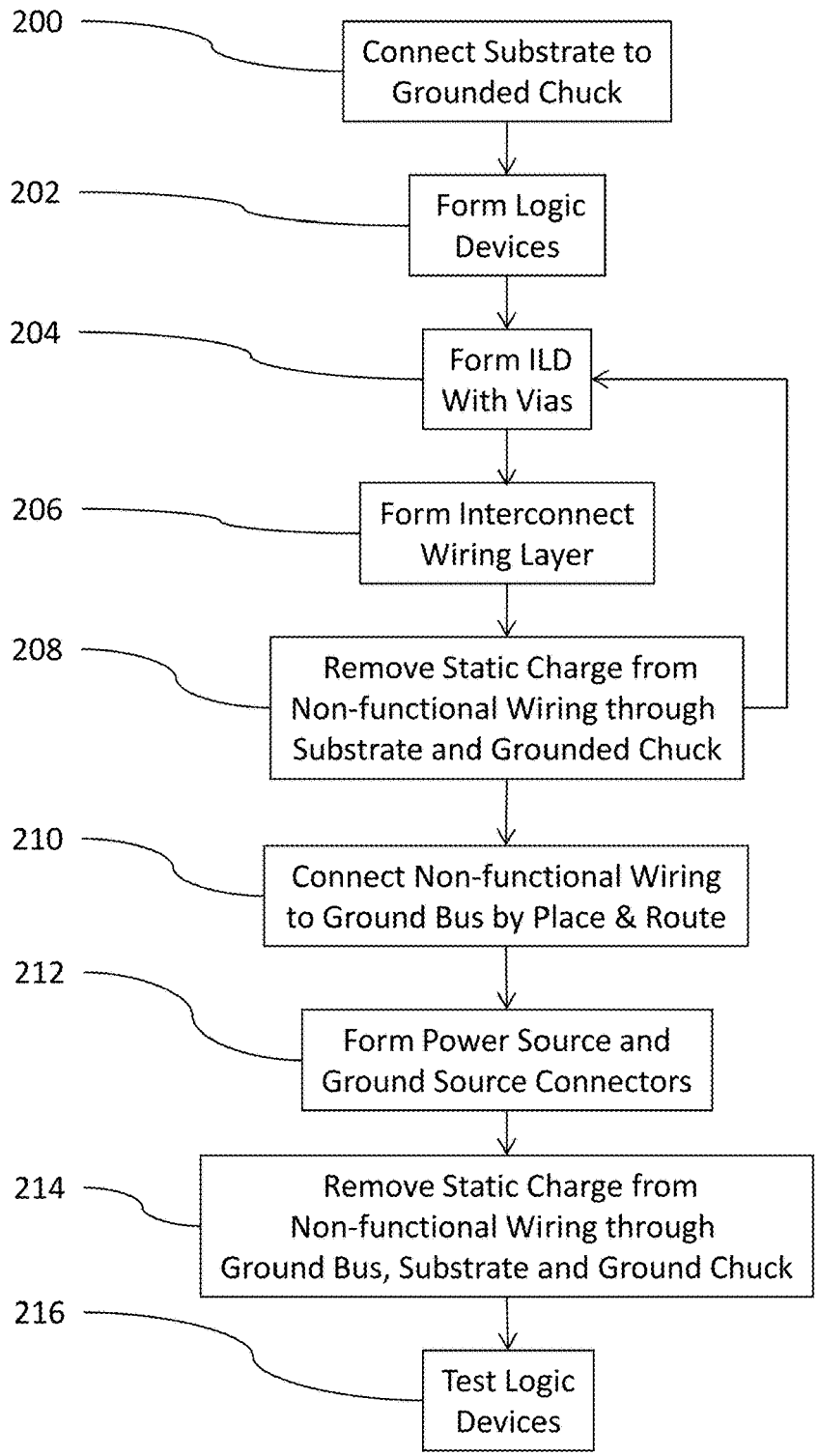
FIG. 12 is a flow diagram illustrating embodiments herein.

Some of the methods of forming various integrated circuit structures herein, as described above, are shown in flowchart form in FIG. 12, where processing begins in item 200 by connecting a substrate to a holding device (chuck) that is grounded (connected to a ground). The substrate provides a conductive static charge dissipation path to the grounded chuck throughout all the manufacturing steps described herein.

Next, as shown in item 202, these methods form logic (electronic) devices (e.g., transistors, diodes, capacitors, etc.) on/in areas of the substrate electrically insulated from the static grounding conductor to form a device layer. Any methods/processing can be used to form such devices, whether currently known or developed in the future.

These methods also form alternating insulator layers and wiring layers on the device layer in items 204-208 to produce a multi-layer interconnect structure on the device layer. More specifically, the multi-layer interconnect structure is produced by forming an insulator layer (such as an inter-layer dielectric (ILD)) patterned with conductive vias that extend through the insulator layer, as shown in item 204. Next, in item 206, such processing patterns functional wiring (power and ground wiring) and simultaneously patterns non-functional wiring (dummy fill) in a wiring layer (where conductors are patterned and then covered with yet another insulator that is formed on the previous insulator layer, formed in item 204). When forming the insulator layer in item 204, the conductive vias are formed to connect the power and ground wiring in the wiring layers to the electronic devices in the device layer.

As noted previously, the processing that forms the vias 204 and conductors 206, can include steps that can create a static charge. Therefore, as shown in item 208, the non-functional wiring that is electrically connected to the p+ wells in the substrate, through the vias, allows this static charge to be removed through the substrate to the grounded chuck. This removes the static charge at least within the non-functional wiring before the next processing step that forms additional conductive vias.

As shown by the loop-back arrow, processing returns from item 208 to item 204 to form another insulator layer and wiring layer to complete the multi-layer interconnect structure. In successive layers, the conductive vias are formed in item 204 to connect the functional and non-functional wiring in different wiring layers.

In the processing in items 204-208, the non-functional wiring is formed to be insulated from the power wiring in the wiring layers, and to be insulated from the electronic devices in the device layer. The non-functional wiring, connected to vias, and p+ wells in the substrate provides a static charge dissipation path to the grounded chuck as the device layer and each of the alternating insulator layers and wiring layers are formed in items 204-208.

In addition, at any point in the above processing (although shown here arbitrarily in item 210) the non-functional wiring is connected to the ground bus using automated place and route processes. After the multi-layer interconnect structure is completed, these processes then form power source and ground source connectors that connect to the power and ground wiring, as shown in item 212.

As noted previously, the processing that forms the ground bus (210) and power source and ground source connectors (212), can include steps that can create a static charge. Therefore, as shown in item 214, the non-functional wiring that is electrically connected to the ground bus, and the ground chuck (through the p+ wells and the substrate) allows any accumulated static charge to be removed.

In item 216, these methods provide test signals to the electronic devices through the power source and ground source connectors and the functional wiring to test the electronic devices. Because the non-functional wiring and connected vias provide a conductive static charge dissipation path to the grounded chuck throughout all the manufacturing steps described herein, when the electronic devices are tested in item 216, no static charge remains, which reduces the chance of damage caused by static charges.

For purposes herein, a "semiconductor" is a material or structure that may include an implanted or in situ (e.g., epitaxial grown) impurity that allows the material to sometimes be a conductor and sometimes be an insulator, based on electron and hole carrier concentration. As used herein, "implantation processes" can take any appropriate form (whether now known or developed in the future) and can be, for example, ion implantation, etc. Epitaxial growth occurs in a heated (and sometimes pressurized) environment that is rich with a gas of the material that is to be grown.

For purposes herein, an "insulator" is a relative term that means a material or structure that allows substantially less (<95%) electrical current to flow than does a "conductor." The dielectrics (insulators) mentioned herein can, for example, be grown from either a dry oxygen ambient or steam and then patterned. Alternatively, the dielectrics herein may be formed from any of the many candidate high dielectric constant (high-k) materials, including but not limited to silicon nitride, silicon oxynitride, a gate dielectric stack of $SiO_2$ and $Si_3N_4$, and metal oxides like tantalum oxide. The thickness of dielectrics herein may vary contingent upon the required device performance.

The conductors mentioned herein can be formed of any conductive material, such as polycrystalline silicon (polysilicon), amorphous silicon, a combination of amorphous silicon and polysilicon, and polysilicon-germanium, rendered conductive by the presence of a suitable dopant. Alternatively, the conductors herein may be one or more metals, such as tungsten, hafnium, tantalum, molybdenum, titanium, or nickel, or a metal silicide, any alloys of such metals, and may be deposited using physical vapor deposition, chemical vapor deposition, or any other technique known in the art.

There are various types of transistors, which have slight differences in how they are used in a circuit. For example, a bipolar transistor has terminals labeled base, collector, and emitter. A small current at the base terminal (that is, flowing between the base and the emitter) can control, or switch, a much larger current between the collector and emitter terminals. Another example is a field-effect transistor, which has terminals labeled gate, source, and drain. A voltage at the gate can control a current between source and drain. Within such transistors, a semiconductor (channel region) is positioned between the conductive source region and the similarly conductive drain (or conductive source/emitter regions), and when the semiconductor is in a conductive state, the semiconductor allows electrical current to flow between the source and drain, or collector and emitter. The gate is a conductive element that is electrically separated from the semiconductor by a "gate oxide" (which is an insulator); and current/voltage within the gate changes makes the channel region conductive, allowing electrical current to flow between the source and drain. Similarly, current flowing between the base and the emitter makes the semiconductor conductive, allowing current to flow between the collector and emitter.

A positive-type transistor "P-type transistor" uses impurities such as boron, aluminum or gallium, etc., within an intrinsic semiconductor substrate (to create deficiencies of valence electrons) as a semiconductor region. Similarly, an "N-type transistor" is a negative-type transistor that uses impurities such as antimony, arsenic or phosphorous, etc., within an intrinsic semiconductor substrate (to create excessive valence electrons) as a semiconductor region.

Generally, transistor structures are formed by depositing or implanting impurities into a substrate to form at least one semiconductor channel region, bordered by shallow trench isolation regions below the top (upper) surface of the substrate. A "substrate" herein can be any material appropriate for the given purpose (whether now known or developed in the future) and can be, for example, silicon-based wafers (bulk materials), ceramic materials, organic materials, oxide materials, nitride materials, etc., whether doped or undoped. "Shallow trench isolation" (STI) structures are generally formed by patterning openings/trenches within the substrate and growing or filling the openings with a highly insulating material (this allows different active areas of the substrate to be electrically isolated from one another).

When patterning any material herein, the material to be patterned can be grown or deposited in any known manner and a patterning layer (such as an organic photoresist) can be formed over the material. The patterning layer (resist) can be exposed to some pattern of light radiation (e.g., patterned exposure, laser exposure, etc.) provided in a light exposure pattern, and then the resist is developed using a chemical agent. This process changes the physical characteristics of the portion of the resist that was exposed to the light. Then one portion of the resist can be rinsed off, leaving the other portion of the resist to protect the material to be patterned (which portion of the resist that is rinsed off depends upon whether the resist is a negative resist (illuminated portions remain) or positive resist (illuminated portions are rinsed off). A material removal process is then performed (e.g., wet etching, anisotropic etching (orientation dependent etching), plasma etching (reactive ion etching (RIE), etc.)) to remove the unprotected portions of the material below the resist to be patterned. The resist is subsequently removed to leave the underlying material patterned according to the light exposure pattern (or a negative image thereof).

While only one or a limited number of integrated circuit structures are illustrated in the drawings, those ordinarily skilled in the art would understand that many different types integrated circuit structures could be simultaneously formed with the embodiment herein and the drawings are intended to show simultaneous formation of multiple different types of integrated circuit structures; however, the drawings have been simplified to only show a limited number of integrated circuit structures for clarity and to allow the reader to more easily recognize the different features illustrated. This is not intended to limit this disclosure because, as would be understood by those ordinarily skilled in the art, this disclosure is applicable to structures that include many of each type of integrated circuit structures shown in the drawings.

The flowchart and block diagrams in the figures illustrate the architecture, functionality, and operation of possible implementations of devices and methods according to various embodiments. In this regard, each block in the flowchart or block diagrams may represent a module, segment, or portion of instructions, which includes one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the foregoing. As used herein, the singular forms "a," "an," and "the" are intended to include the plural forms as well, unless the context clearly indicates otherwise. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements).

Embodiments herein may be used in a variety of electronic applications, including but not limited to advanced sensors, memory/data storage, semiconductors, microprocessors and other applications. A resulting device and structure, such as an integrated circuit (IC) chip can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The description of the present embodiments has been presented for purposes of illustration and description, but is not intended to be exhaustive or limited to the embodiments in the form disclosed. Many modifications and variations will be apparent to those of ordinary skill in the art without departing from the scope and spirit of the embodiments herein. The embodiments were chosen and described in order to best explain the principles of such, and the practical application, and to enable others of ordinary skill in the art to understand the various embodiments with various modifications as are suited to the particular use contemplated.

While the foregoing has been described in detail in connection with only a limited number of embodiments, it should be readily understood that the embodiments herein are not limited to such disclosure. Rather, the elements herein can be modified to incorporate any number of variations, alterations, substitutions or equivalent arrangements not heretofore described, but which are commensurate with the spirit and scope herein. Additionally, while various embodiments have been described, it is to be understood that aspects herein may be included by only some of the described embodiments. Accordingly, the claims below are not to be seen as limited by the foregoing description. A reference to an element in the singular is not intended to mean "one and only one" unless specifically stated, but rather "one or more." All structural and functional equivalents to the elements of the various embodiments described throughout this disclosure that are known or later, come to be known, to those of ordinary skill in the art are expressly incorporated herein by reference and intended to be encompassed by this disclosure. It is therefore to be understood that changes may be made in the particular embodiments disclosed which are within the scope of the foregoing as outlined by the appended claims.

What is claimed is:

1. An integrated circuit structure comprising:
   a substrate;
   a device layer on the substrate, wherein the device layer comprises electronic devices; and
   a multi-layer interconnect structure connected to the device layer, wherein the multi-layer interconnect structure comprises:
   alternating insulator layers and wiring layers;
   power and ground wiring in the wiring layers;
   non-functional wiring in the wiring layers; and
   conductive vias extending through the insulator layers,
   wherein the conductive vias connect the power and ground wiring in the wiring layers to the electronic devices in the device layer,
   wherein the conductive vias connect the non-functional wiring in the wiring layers to a ground connection, and wherein the non-functional wiring is insulated from the power wiring in the wiring layer and from the electronic devices in the device layer.

2. The integrated circuit structure according to claim 1, wherein the ground connection is the substrate or the ground wiring.

3. The integrated circuit structure according to claim 1, wherein the substrate is electrically connected to ground to dissipate charge accumulated in the multi-layer interconnect structure during manufacturing.

4. The integrated circuit structure according to claim 1, wherein the substrate is connectable to a grounded chuck holding the substrate during manufacturing.

5. The integrated circuit structure according to claim 1, wherein the substrate includes impurity wells electrically connected to the non-functional wiring.

6. The integrated circuit structure according to claim 1, wherein each of the wiring layers includes an electrical connection from the non-functional wiring to the substrate.

7. The integrated circuit structure according to claim 1, further comprising power source and ground source connectors connected to the power and ground wiring.

8. A method of forming an integrated circuit structure comprising:
   connecting a substrate to a grounded chuck;
   forming electronic devices on the substrate to form a device layer; and
   forming alternating insulator layers and wiring layers on the device layer to produce a multi-layer interconnect structure on the device layer by:
      patterning power and ground wiring in the wiring layers;
      patterning non-functional wiring in the wiring layers; and
      patterning conductive vias extending through the insulator layers,
   wherein the conductive vias are formed to connect the power and ground wiring in the wiring layers to the electronic devices in the device layer,
   wherein the conductive vias are formed to connect the non-functional wiring in the wiring layers to a ground connection, and
   wherein the non-functional wiring is formed to be insulated from the power wiring in the wiring layer and from the electronic devices in the device layer.

9. The method according to claim 8, wherein the ground connection is the substrate or the ground wiring.

10. The method according to claim 8, wherein the substrate provides a static charge dissipation path from the wiring layers to the grounded chuck.

11. The method according to claim 8, wherein the substrate is held by the grounded chuck during manufacturing.

12. The method according to claim 8, wherein the substrate is formed to include impurity wells electrically connected to the non-functional wiring.

13. The method according to claim 8, wherein each of the wiring layers is formed to include an electrical connection from the non-functional wiring to the substrate.

14. The method according to claim 8, further comprising forming power source and ground source connectors connected to the power and ground wiring.

15. A method of forming an integrated circuit structure comprising:
   connecting a substrate to a grounded chuck;
   forming electronic devices on the substrate to form a device layer;
   forming alternating insulator layers and wiring layers on the device layer to produce a multi-layer interconnect structure on the device layer by:
      patterning power and ground wiring in the wiring layers;
      patterning non-functional wiring in the wiring layers; and
      patterning conductive vias extending through the insulator layers, wherein the conductive vias are formed to connect the power and ground wiring in the wiring layers to the electronic devices in the device layer, wherein the conductive vias are formed to connect the non-functional wiring in the wiring layers to a ground connection, wherein the non-functional wiring is formed to be insulated from the power wiring in the wiring layer and from the electronic devices in the device layer, and wherein the substrate provides a static charge dissipation path from the wiring layers to the grounded chuck.

16. The method according to claim 15, wherein the ground connection is the substrate or the ground wiring.

17. The method according to claim 15, wherein the substrate is held by the grounded chuck during manufacturing.

18. The method according to claim 15, wherein the substrate is formed to include impurity wells electrically connected to the non-functional wiring.

19. The method according to claim 15, wherein each of the wiring layers is formed to include an electrical connection from the non-functional wiring to the substrate.

20. The method according to claim 15, further comprising testing the electronic devices by sending test signals through the power and ground wiring, wherein the wiring layers are devoid of static charge during the testing.

* * * * *